United States Patent
Park et al.

(10) Patent No.: US 7,616,056 B2
(45) Date of Patent: Nov. 10, 2009

(54) NAUTA OPERATIONAL TRANSCONDUCTANCE AMPLIFIER

(75) Inventors: Jung Woo Park, Daejeon (KR); Cheon Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 209 days.

(21) Appl. No.: 11/942,935

(22) Filed: Nov. 20, 2007

(65) Prior Publication Data

US 2009/0115516 A1 May 7, 2009

(30) Foreign Application Priority Data

Dec. 5, 2006 (KR) .................. 10-2006-0122182
Jun. 15, 2007 (KR) .................. 10-2007-0058789

(51) Int. Cl.
*H03F 3/45* (2006.01)

(52) U.S. Cl. ........................... 330/69; 330/253

(58) Field of Classification Search ........... 330/69, 330/253, 257, 260, 261
See application file for complete search history.

(56) References Cited

U.S. PATENT DOCUMENTS

| | | | |
|---|---|---|---|
| 5,570,049 A | 10/1996 | Chen | |
| 5,789,973 A * | 8/1998 | Barrett et al. | 327/561 |
| 6,160,446 A | 12/2000 | Azimi et al. | |
| 6,191,655 B1 | 2/2001 | Moughabghab | |
| 6,466,090 B1 * | 10/2002 | Giuroiu | 330/86 |
| 6,476,676 B1 | 11/2002 | Tanaka et al. | |
| 6,577,212 B1 | 6/2003 | Mattisson et al. | |
| 7,042,291 B2 * | 5/2006 | Ueno et al. | 330/258 |
| 7,116,132 B2 | 10/2006 | Lehto | |
| 7,292,095 B2 * | 11/2007 | Burt et al. | 330/9 |
| 7,382,183 B2 * | 6/2008 | Nolan et al. | 330/9 |

FOREIGN PATENT DOCUMENTS

| | | |
|---|---|---|
| EP | 0664937 | 8/1995 |
| JP | 60-214611 | 10/1985 |
| KR | 20000035417 | 6/2000 |
| WO | WO00/44090 | 7/2000 |

\* cited by examiner

*Primary Examiner*—Henry K Choe
(74) *Attorney, Agent, or Firm*—Rabin & Berdo, P.C.

(57) ABSTRACT

Provided is an operational transconductance amplifier (OTA). An existing Nauta transconductor used to implement a high frequency Gm-C filter integrated circuit (IC) is analyzed by a new method and from a new perspective to remove extra components and divide roles of remaining inverters for more simple and efficient circuit structure. In an existing Nauta transconductor, a common mode signal from an input terminal is amplified and appears at an output terminal, while in the inventive Nauta transconductor the common mode signal from an input terminal does not appear at the output terminal and is effectively eliminated. These enhanced characteristics can be achieved with a smaller number of inverters than an existing Nauta transconductor. Frequency characteristics of the filter can be effectively enhanced by independently controlling the quality factor without affecting the transconductance value required for frequency characteristics of the filter.

10 Claims, 4 Drawing Sheets

NAUTA OPERATIONAL TRANSCONDUCTANCE AMPLIFIER

CROSS-REFERENCE TO RELATED APPLICATION

This application claims priority to and the benefit of Korean Patent Application No. 2006-122182, filed Dec. 5, 2006, and No. 2007-58789, filed Jun. 15, 2007, the disclosure of which is incorporated herein by reference in its entirety.

BACKGROUND

1. Field of the Invention

The present invention relates to operational transconductance amplifiers widely used to implement analog circuits such as filters, and more particularly, to an operational transconductance amplifier (OTA) for a Gm-C filter fabricated by an integrated circuit (IC) process.

This work was supported by the IT R&D program of Ministry of Information and Communication/Institute for Information Technology Advancement [2005-S-075-02, Development of SoC for Wired and Wireless Unified Network.]

2. Discussion of Related Art

In a conventional wireless communication transceiver, a high frequency analog signal at radio frequency (RF) stage is converted to a low frequency analog signal through a low-noise amplifying and downconverting process. The resultant analog signal generally contains unwanted frequency signal components. A filter eliminates such frequency components and passes only a pure signal component to a digital signal processing block. A Gm-C filter includes an operational transconductance amplifier (OTA) as a basic building block.

The OTA is a functional block which receives a voltage signal as an input and outputs a current signal. Assuming that an input signal is $V_{input}$ and an output signal is $I_{output}$ there exists the following relationship between the input and output signal:

$$I_{output} = g_m V_{input} \qquad (1)$$

where $g_m$ denotes a proportional coefficient commonly called a conductance gain or simply conductance. An LC filter typically requires an inductor and a capacitor of large value. So, it is difficult for the inductor to be fabricated on an integrated circuit because of occupied area or the quality factor. Accordingly, an active filter is used as an alternative to the LC filter.

In the active filter, an impedance of the inductor is implemented by an integrator or a gyrator, which consists of a transconductance element and a capacitor. A functional block, called an impedance inverter, which allows a capacitor to act as an inductor can be implemented by a gyrator consisting of two operational transconductance amplifiers.

But, we encounter various nonideal or nonlinear characteristics while we design OTA. Only after you solve those problems can you implement the desired operational characteristics of the filter. In particular, in order to implement a filter operating at a high frequency, it is desirable to minimize number of OTA internal nodes causing parasite capacitances, which is the most serious obstacle to the high frequency operation of filters.

A representative example that adopts this idea is an operational transconductance amplifier proposed by Bram Nauta ("Nauta OTA"). In general, the Nauta OTA includes single input single output inverter as basic unit cell, as shown in FIG. 1. The Nauta OTA effectively amplifies only the differential mode component among signal components while suppressing the common mode component. Since the inverter, which has no nodes other than power and ground nodes, is used as the basic unit cell, the Nauta OTA is highly advantageous for high frequency operation. And, since the Nauta OTA includes only two transistors in series between the power node and the ground node, it is also suitable for a low voltage operation.

However, in the Nauta OTA having such a structure, a common mode component of an input signal appears with a certain gain at an output side, and it is difficult to increase the quality factor. These will now be analyzed in conjunction with the conventional Nauta OTA shown in FIG. 1, where $$i_1 = g_{m1}v_{i1} + g_{m2a}v_{o1} + g_{m2b}v_{o2} + (g_{o1} + g_{o2a} + g_{o2b})v_{o1} \qquad (2)$$

and $$i_2 = g_{m1}v_{i2} + g_{m2a}v_{o2} + g_{m2b}v_{o1} + (g_{o1} + g_{o2a} + g_{o2b})v_{o2} \qquad (3)$$

As usual, assuming $(g_{m1}=g_{m2a}=g_{m2b})=g_m$ and $(g_{o1}=g_{o2a}=g_{o2b})=g_o$, we obtain Equations 4 and 5:

$$i_1 = g_m(v_{i1}+v_{o1}+v_{o2})+3g_o v_{o1} \qquad (4)$$

and $$i_2 = g_m(v_{i2}+v_{o2}+v_{o1})+3g_o v_{o2} \qquad (5)$$

Here, $$v_{o1} = -zi_1$$

$$v_{o2} = -zi_2 \qquad (6)$$

And, Equations 7 and 8 are obtained:

$$v_{o1} = -zg_m(v_{i1}+v_{o1}+v_{o2}) - 3zg_o v_{o1} \qquad (7)$$

$$v_{o2} = -zg_m(v_{i2}+v_{o2}+v_{o1}) - 3zg_o v_{o2} \qquad (8)$$

These equations are expressed by a matrix equation:

$$\begin{bmatrix} 1+zg_m+3zg_o & zg_m \\ zg_m & 1+zg_m+3zg_o \end{bmatrix} \begin{bmatrix} v_{o1} \\ v_{o2} \end{bmatrix} = -zg_m \begin{bmatrix} 1 & 0 \\ 0 & 1 \end{bmatrix} \begin{bmatrix} v_{i1} \\ v_{i2} \end{bmatrix} \qquad (9)$$

Both sides of Equation 9 are multiplied by y to obtain Equation 10:

$$\begin{bmatrix} y+g_m+3g_o & g_m \\ g_m & y+g_m+3g_o \end{bmatrix} \begin{bmatrix} v_{o1} \\ v_{o2} \end{bmatrix} = -g_m \begin{bmatrix} 1 & 0 \\ 0 & 1 \end{bmatrix} \begin{bmatrix} v_{i1} \\ v_{i2} \end{bmatrix} \qquad (10)$$

This is a basic input/output equation of the conventional Nauta OTA.

Using a capacitive load (a capacitor) as load admittance, Equation 10 is Laplace transformed into Equation 11:

$$\begin{bmatrix} sC+g_m+3g_o & g_m \\ g_m & sC+g_m+3g_o \end{bmatrix} \begin{bmatrix} v_{o1} \\ v_{o2} \end{bmatrix} = g_m \begin{bmatrix} 1 & 0 \\ 0 & 1 \end{bmatrix} \begin{bmatrix} v_{i1} \\ v_{i2} \end{bmatrix} \qquad (11)$$

Both sides of Equation 11 are divided by C to obtain Equations 12 and 13:

$$\begin{bmatrix} s + \frac{g_m 3 g_o}{C} & \frac{g_m}{C} \\ \frac{g_m}{C} & s + \frac{g_m + 3 g_o}{C} \end{bmatrix} \begin{bmatrix} V_{o1} \\ V_{o2} \end{bmatrix} = -\frac{g_m}{C} \begin{bmatrix} 1 & 0 \\ 0 & 1 \end{bmatrix} \begin{bmatrix} V_{i1} \\ V_{i2} \end{bmatrix} \quad (12)$$

and $$\left\{ sI - \left(-\frac{1}{C}\right) \begin{bmatrix} g_m + 3 g_o & g_m \\ g_m & g_m + 3 g_o \end{bmatrix} \right\} \begin{bmatrix} V_{o1} \\ V_{o2} \end{bmatrix} = -\frac{g_m}{C} \begin{bmatrix} 1 & 0 \\ 0 & 1 \end{bmatrix} \begin{bmatrix} V_{i1} \\ V_{i2} \end{bmatrix} \quad (13)$$

When $V_{i1}=V_{i2}=0$ (homogeneous), Equation 13 is changed into Equation 14:

$$(sI-A)V_o = 0 \quad (14)$$

$$\Leftrightarrow AV_o = sV_o \quad (15)$$

Now we encounter an issue of an eigenvalue/eigenvector in the form of $A \vec{x} = \lambda \vec{x}$, which is common in quantum mechanics. An eigenvalue/eigenvector of the matrix A must be obtained to find a transformation matrix for diagonalizing the matrix A. The eigenvalue can be obtained by setting the determinant of the coefficient matrix at the left side of Equation 14 to 0. Since A has a form like A+=A, we see that A is a Hermitian or a self-adjoint operator. Accordingly, from the general characteristic of the Hermitian operator, the eigenvalues are expected to have real numbers and the eigenvectors are expected to be orthogonal. Actually, the eigenvalues are found to be real numbers:

$$S = S_1, S_2 \quad (16),$$

where $$S_1 = -\frac{3 g_o}{C} \text{ and } S_2 = -\frac{(2 g_m + 3 g_o)}{C}.$$

Since $$g_o = \frac{1}{r_{out}},$$

$s_1$ and $s_2$ have a dimension of a reciprocal of a time constant in an RC circuit. Corresponding eigenvectors may be obtained by applying $s_1$ and $s_2$ to Equation 14. The magnitudes of the eigenvectors are normalized into 1, resulting in Equations 17 and 18:

$$|r_1\rangle = \frac{1}{\sqrt{2}} \begin{pmatrix} 1 \\ -1 \end{pmatrix} \quad (17)$$

and $$|r_2\rangle = \frac{1}{\sqrt{2}} \begin{pmatrix} 1 \\ 1 \end{pmatrix}, \quad (18)$$

where $|r_i\rangle$ denotes a column vector and $\langle r_j|$ denotes a row vector.

Since the two unit vectors have a relationship of $\langle r_i|r_j\rangle = \delta_{ij}$, they are orthogonal, as mentioned above.

Now, a transformation matrix for diagonalizing the matrix A is constructed as in Equation 19:

$$R = (|r_1\rangle |r_2\rangle) = \frac{1}{\sqrt{2}} \begin{bmatrix} 1 & 1 \\ -1 & 1 \end{bmatrix} \quad (19)$$

The matrix A is diagonalized into a diagonal matrix $\Lambda$ by applying the transformation matrix:

$$R^* A R = R^T A R \quad (20)$$
$$= R^T A (|r_1\rangle |r_2\rangle)$$
$$= R^T (s_1|r_1\rangle s_2|r_2\rangle)$$
$$= \begin{bmatrix} s_1 & 0 \\ 0 & s_2 \end{bmatrix}$$
$$\equiv \Lambda,$$

where $R^+$ is the transpose matrix of the complex-conjugate matrix of R. Equation 13 may be expressed as a matrix equation:

$$(sI - A)\vec{V_o} = \left(-\frac{g_m}{C}\right)\vec{V_i} \quad (21)$$

Performing the following linear transformation on Equation 21:

$$\vec{V}_k = R \vec{V'}_k \text{ where } k=i,o \quad (22),$$

We obtain Equation 23:

$$(sI - A) R \vec{V'_o} = \left(-\frac{g_m}{C}\right) \vec{V'_i} \quad (23)$$

Both sides of Equation 23 are multiplied by $R^{-1}=R^+$ to obtain Equations 24 to 26:

$$R^{-1}\{sI - A\} R \vec{V'_o} = \left(-\frac{g_m}{C}\right) \vec{V'_i} \quad (24)$$

$$\{sI - R^{-1} A R\} \vec{V'_o} = \left(-\frac{g_m}{C}\right) \vec{V'_i} \quad (25)$$

and $$(sI - A)R\vec{V_o'} = \left(-\frac{g_m}{C}\right)\vec{V_i'} \qquad (26)$$

With elements of the matrices of Equation 26 shown:

$$\begin{bmatrix} s-s_1 & 0 \\ 0 & s-s_2 \end{bmatrix}\begin{bmatrix} V_{o1}' \\ V_{o2}' \end{bmatrix} = -\frac{g_m}{C}\begin{bmatrix} 1 & 0 \\ 0 & 1 \end{bmatrix}\begin{bmatrix} V_{i1}' \\ V_{i2}' \end{bmatrix} \qquad (27)$$

Here, we find that the form of the transformation matrix R is exactly the same as that of the matrix describing a rotation (a rotational angle=45°) of a coordinate system on a plane. A relation of the transformation matrix R with rotational transformation will now be analyzed. For this purpose, consider the problem of a general coordinate system rotation on a plane with reference to FIG. 3. Let the matrix A represent a vector rotation which maps a vector $\vec{r}$ into a new vector $A\vec{r}$:

$$\vec{r_1} = A\vec{r} \qquad (28)$$

Then, a rotation of a coordinate axis B ($\vec{r'}=B\vec{r}$) is applied to map a given vector expression from $$\begin{bmatrix} x \\ y \end{bmatrix} \text{ to } \begin{bmatrix} x' \\ y' \end{bmatrix}:$$

$$\begin{aligned} B\vec{r_1} &= BA\vec{r} \\ &= BA(B^{-1}B)\vec{r} \\ &= (BAB^{-1})(B\vec{r}) \end{aligned} \qquad (29)$$

Noting that $B\vec{r_1}$ in the left side is an expression of $\vec{r_1}$ in new coordinate system and $B\vec{r}$ in the right side is an expression of $\vec{r}$ in new coordinate system, we know that the linear transformation denoted by matrix A in old coordinate system is now denoted by matrix A'=(BAB$^{-1}$) in the new coordinate system. This means that the role played by matrix A in vector space $$\begin{bmatrix} x \\ y \end{bmatrix}$$

is played by matrix A'=(BAB$^{-1}$) in vector space $$\begin{bmatrix} x' \\ y' \end{bmatrix}.$$

(This transformation relation is called "similarity transformation"). And when matrix B denotes a coordinate-system rotation of angle θ in a counter-clockwise direction, B is described as:

$$B = \begin{bmatrix} \cos\theta & \sin\theta \\ -\sin\theta & \cos\theta \end{bmatrix} \qquad (30)$$

In this equation element $b_{ij}$ of matrix B means a direction cosine:

$$\begin{aligned} b_{ij} &= \cos(x_i' \cdot x_j) \\ &= \hat{x}_i' \cdot \hat{x}_j \end{aligned} \qquad (31)$$

Now the correlation between the transformation matrix R and the matrix describing a rotation of coordinate system is described:

We can regard a vector $$\vec{V_k} = \begin{bmatrix} V_{k1} \\ V_{k2} \end{bmatrix}$$

as a component representation in a reference coordinate system $$\begin{bmatrix} x \\ y \end{bmatrix}:$$

$$\begin{aligned} \vec{V_k} &= \begin{bmatrix} V_{k1} \\ V_{k2} \end{bmatrix} \\ &= V_{k1}\begin{bmatrix} 1 \\ 0 \end{bmatrix} + V_{k2}\begin{bmatrix} 0 \\ 1 \end{bmatrix} \\ &= V_{k1}\hat{e}_1 + V_{k2}\hat{e}_2 \end{aligned} \qquad (32)$$

where $k = i, o$

If we apply to an arbitrary fixed vector $\vec{V_k}$ a linear transformation B which represent a rotation of coordinate system from $$\begin{bmatrix} x \\ y \end{bmatrix} \text{ to } \begin{bmatrix} x' \\ y' \end{bmatrix}$$

expression $\vec{V_k'}$ of $\vec{V_k}$ in the new coordinate system $$\begin{bmatrix} x' \\ y' \end{bmatrix}$$

becomes:

$$\vec{V_k'} = B\vec{V_k} \qquad (33)$$

When we compare the form of Equation 25 with that of Equation 29, we can understand $\vec{V}_{k'}$ in Equation 33 as the representation of some fixed vector in the new coordinate system after a rotation of coordinate system. If we adopt a point of view in which matrix A is regarded as an operator, it is understood that the role played by matrix A in a relation with the vector $\vec{V}_o$ in the old coordinate system is played by matrix $A'=BAB^{-1}$) in a relation with the vector $\vec{V}_{o'}$ in the new coordinate system. Therefore, we find that Equation 25 is a representation of the original Equation 21 in the new coordinate system $$\begin{bmatrix} x' \\ y' \end{bmatrix}.$$

Now, matrix B which describes a rotation of coordinate system needs to be found.

From Equation 22, $\vec{V'}_k = R^{-1}\vec{V}_k$ where k=i,o is obtained. When we compare this with Equation 33, we find that the matrix B which describes a rotation of coordinate system is $B=R^{-1}$. Therefore, the matrix $R^+=R^T=R^{-1}$ can be regarded as the matrix B which describes a rotation of coordinate system in a plane (Accordingly, $R=B^{-1}$). In other words, if we select specially the inverse $R^{-1}$ of the matrix R consisting of eigenvectors for the matrix B which describes a rotation of the coordinate system as shown in FIG. 3, the expression $A'=(BAB^{-1})$ of matrix A in the new coordinate system becomes simply diagonalized as shown in Equation 27. Here, $$R^+ = R^T = \frac{1}{\sqrt{2}}\begin{bmatrix} 1 & -1 \\ 1 & 1 \end{bmatrix} \quad (34)$$

comprises two unit row vectors <r1| and <r2|, each of which represents direction cosine associated with axes x' and y' respectively in the original coordinate system. Equating Equation 34 to Equation 30, we know that the angle of coordinate system rotation is given as θ=−45°. Since matrix $R+=R^T$ rotates a coordinate system to another coordinate system in which A is described as a diagonal matrix, this new coordinate system is represented as two eigenvectors |r1>, |r2>. These two eigenvectors are the unit vectors ($\hat{e}_1$, $\hat{e}_2$ in FIG. 4) on the new coordinate axes (called "Principal Axis") in which matrix A is described as a diagonal matrix.

Now apply the following linear transformation to input signal pair and output signal pair using the transformation matrix R derived above (For convenience, we use $DM_k$ instead of $V'_{k1}$ and $CM_k$ instead of $V'_{k2}$:

$$\underbrace{\begin{bmatrix} V_{k1} \\ V_{k2} \end{bmatrix} = \frac{1}{\sqrt{2}}\begin{bmatrix} 1 & 1 \\ -1 & 1 \end{bmatrix}}_{R}\begin{bmatrix} DM_k \\ CM_k \end{bmatrix} \text{ where } k=i,o \quad (35)$$

From this, we obtain:

$$\begin{bmatrix} DM_k \\ CM_k \end{bmatrix} = \frac{1}{\sqrt{2}}\begin{bmatrix} 1 & -1 \\ 1 & 1 \end{bmatrix}\begin{bmatrix} V_{k1} \\ V_{k2} \end{bmatrix} \text{ where } k=i,o \quad (36)$$

From Equation 36, the following equations are obtained:

$$\begin{bmatrix} V_{o1} \\ V_{o2} \end{bmatrix} = \frac{1}{\sqrt{2}}\begin{bmatrix} 1 & 1 \\ -1 & 1 \end{bmatrix}\begin{bmatrix} DM_o \\ CM_o \end{bmatrix} \quad (k=o) \quad (37)$$

and $$\begin{bmatrix} V_{i1} \\ V_{i2} \end{bmatrix} = \frac{1}{\sqrt{2}}\begin{bmatrix} 1 & 1 \\ -1 & 1 \end{bmatrix}\begin{bmatrix} DM_i \\ CM_i \end{bmatrix} \quad (k=i) \quad (38)$$

If we insert Equations 37 and 38 to Equation 13 and arrange the resultant equation, we obtain:

$$\begin{bmatrix} DM_o \\ CM_o \end{bmatrix} = g_m \begin{bmatrix} \frac{-1}{sC+3g_o} & 0 \\ 0 & \frac{-1}{sC+2g_m+3g_o} \end{bmatrix}\begin{bmatrix} DM_i \\ CM_i \end{bmatrix} \quad (39)$$

Physical amplifications which Equation 39 has are as follows: Equation 39 represent forward-direction transfer characteristic from input $DM_i$, $CM_i$ at input port to output $DM_o$, $CM_o$ at output port. First of all, we find in this transfer characteristic that common-mode of input signal $CM_i$ has influence only on common-mode of output signal $CM_o$ and that differential-mode of input signal $DM_i$ has influence only on differential-mode of output signal $DM_o$. This means that decoupling of differential-mode from common-mode is perfectly achieved.

This characteristic is very desirable, considering that the signal we want to process is not contained in the common-mode. Furthermore, the transconductor will approach the more ideal characteristic if common-mode signal gain can be completely nullified. However, we can point out that it is not easy to increase only the quality factor of the conventional Nauta-OTA, as is seen in equation 39.

In fact, in case of UWB transceiver where very high frequency operation in the range of several hundreds of MHz is required, $g_m$ value needed is very large so that the quality factor becomes substantially reduced. Nevertheless, any practical means independently to control the quality factor is not provided, raising an important issue. The following OTA structure is proposed to resolve these problems of the conventional Nauta-OTA.

SUMMARY OF THE INVENTION

The present invention is directed to a new OTA circuit structure capable of fully eliminating a common mode component in a conventional Nauta OTA circuit structure and effectively enhancing a quality factor by independently controlling the quality factor.

One aspect of the present invention provides an operational transconductance amplifier (OTA) for receiving first and second input voltages and outputting first and second output currents proportional to a voltage difference between the first and second input voltages, the amplifier comprising: the first parallel converting cell having a positive input terminal for receiving the first input voltage and a negative input terminal for receiving the second input voltage; the second parallel converting cell having a positive input terminal for receiving the second input voltage and a negative input terminal for receiving the first input voltage; the first cross feedback converting cell having a positive input terminal connected to an output terminal of the second parallel converting cell, a negative input terminal connected to a ground voltage terminal, and an output terminal connected to an output terminal of the first parallel converting cell; and the second cross feedback converting cell having a positive input terminal connected to the output terminal of the first parallel converting cell, a negative input terminal connected to the ground voltage terminal, and an output terminal connected to the output terminal of the second parallel converting cell.

The amplifier may further comprises: the first self feedback converting cell having a positive input terminal connected to the output terminal of the first parallel converting cell, a negative input terminal connected to the ground voltage terminal, and an output terminal fed back to the positive input terminal; and the second self feedback converting cell having a positive input terminal connected to the output terminal of the second parallel converting cell, a negative input terminal connected to the ground voltage terminal, and an output terminal fed back to the positive input terminal.

The first and second parallel converting cells, the first and second self feedback converting cells, and the first and second cross feedback converting cells may be implemented by elements for outputting, via an output terminal, a current proportional to a difference between a voltage at a positive input terminal and a voltage at a negative input terminal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

An operational transconductance amplifier (OTA) according to an exemplary embodiment of the present invention will now be described with reference to FIG. 2.

Figure 1:
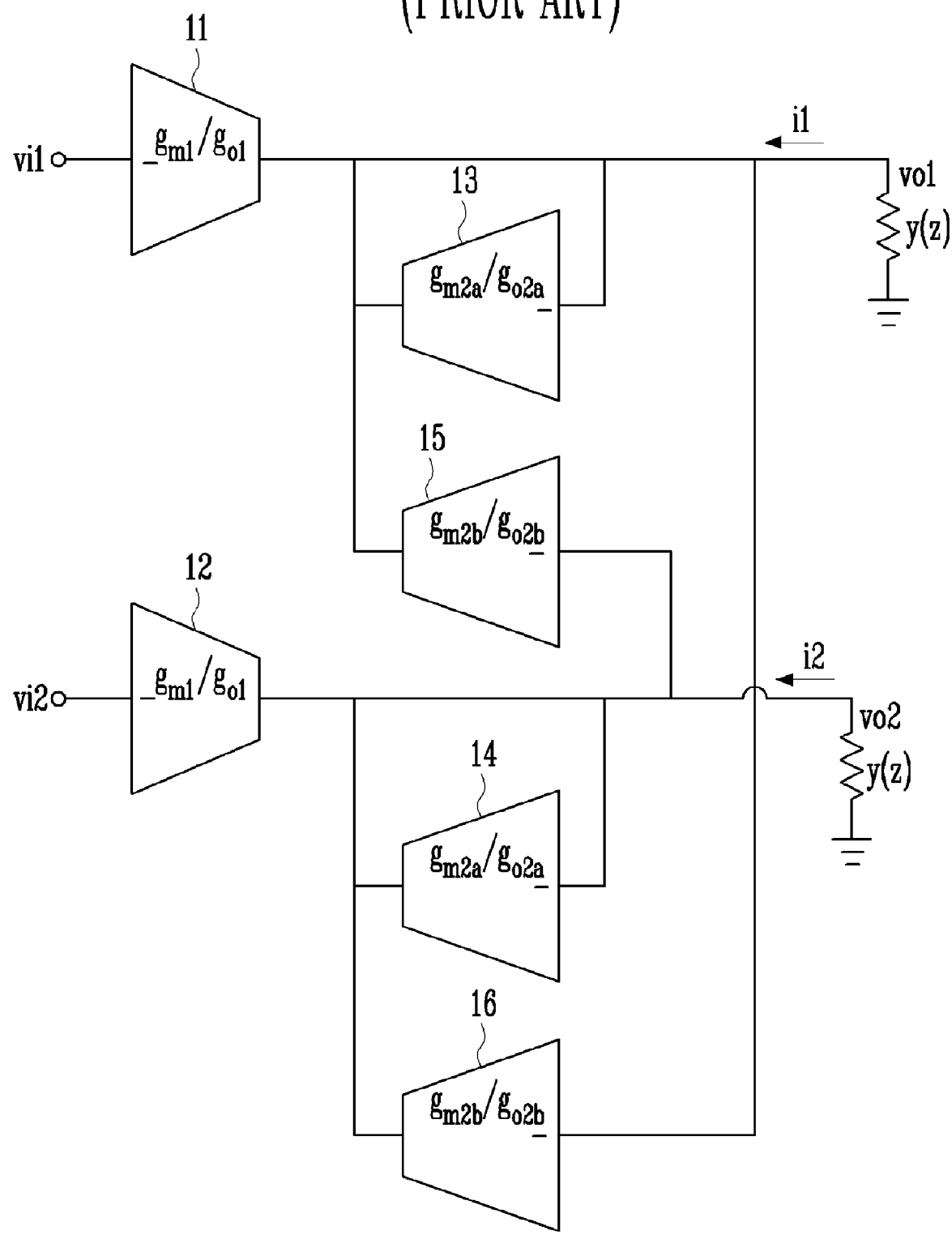
FIG. 1 is a circuit diagram of a conventional Nauta OTA.
Figure 2:
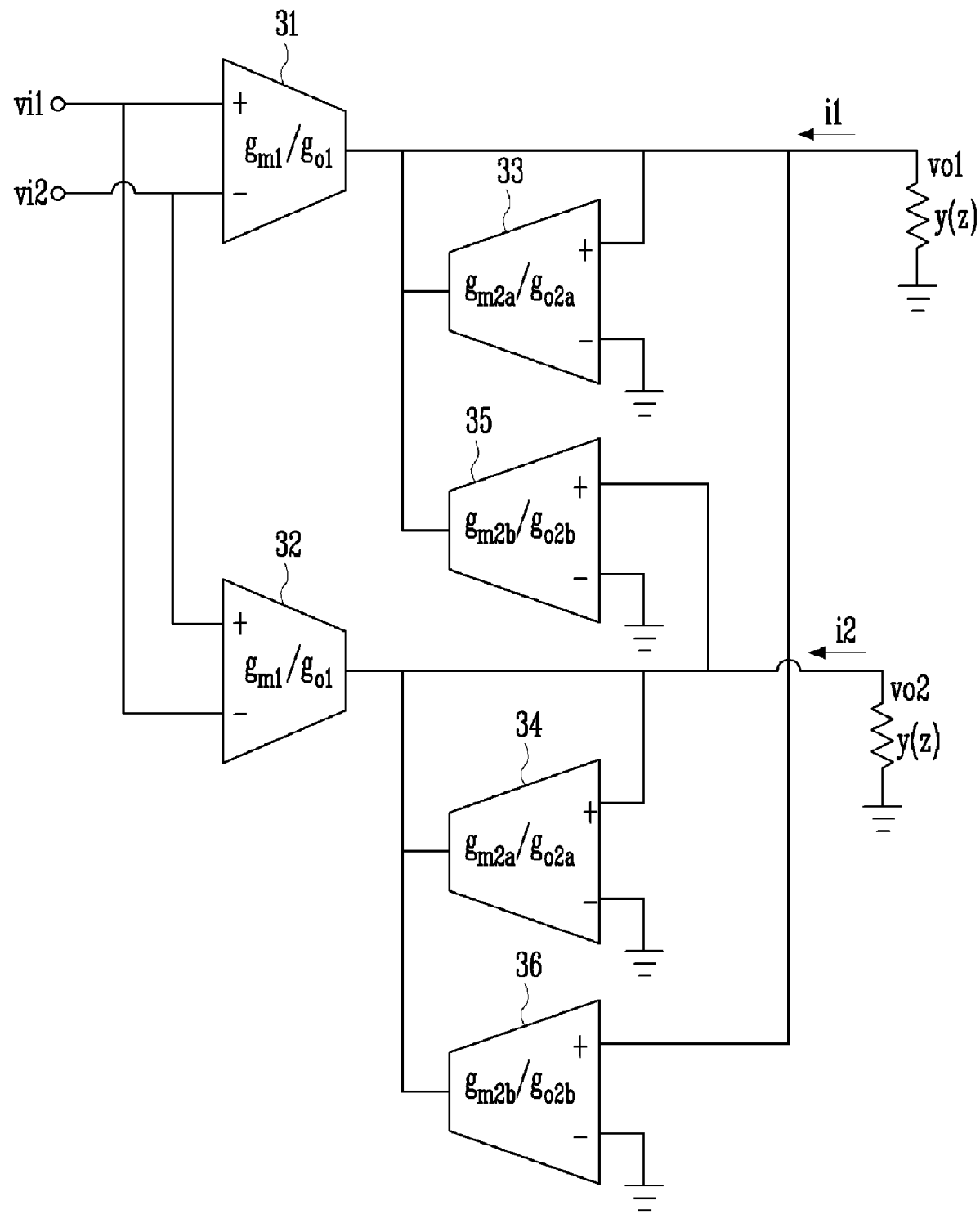
FIG. 2 is a circuit diagram of an enhanced Nauta OTA according to the present invention.
Figure 3:
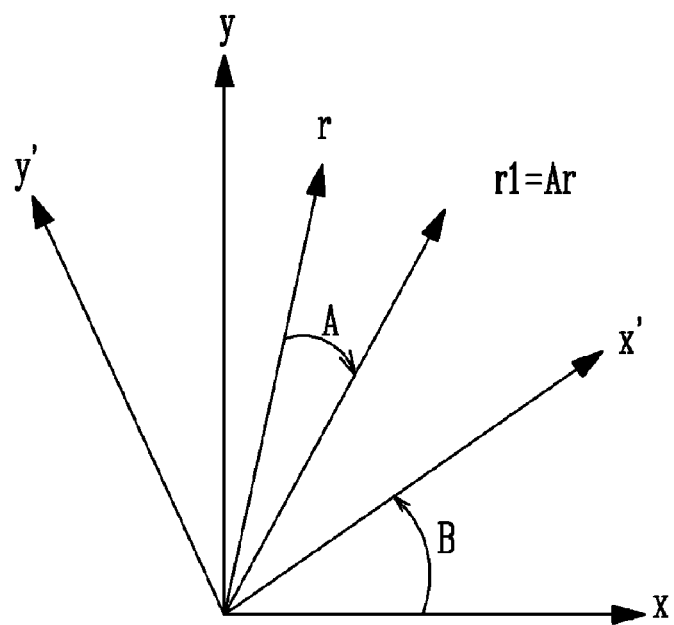
FIG. 3 illustrates a vector rotation and a coordinate system rotation on a plane.
Figure 4:
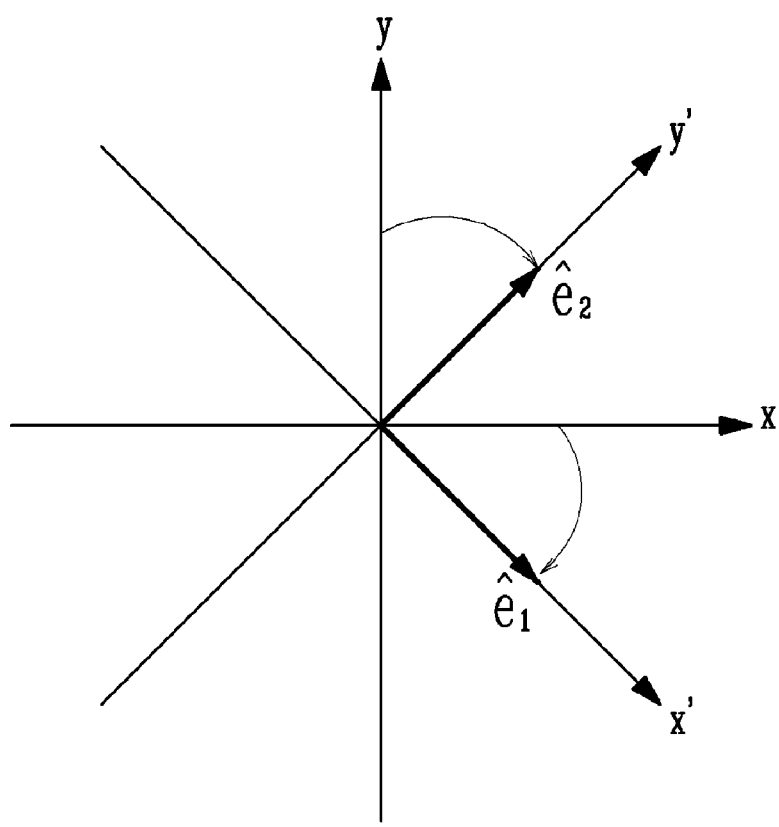
FIG. 4 illustrates new axes (principal axes) in which matrix A is described as a diagonal matrix and the unit vectors on the coordinate axes.

Referring to FIG. 2, the OTA of the present exemplary embodiment receives the first input voltage vi1 and the second input voltage vi2 and outputs the first output current i1 and the second output current i2 which include current component proportional to the difference between the first input voltage vi1 and the second input voltage vi2.

The OTA includes: the first parallel converting cell 31 having a positive input terminal for receiving the first input voltage vi1 and a negative input terminal for receiving the second input voltage vi2; the second parallel converting cell 32 having a positive input terminal for receiving the second input voltage vi2 and a negative input terminal for receiving the first input voltage vi1; the first self feedback converting cell 33 having a positive input terminal connected to an output terminal of the first parallel converting cell 31, a negative input terminal connected to a ground voltage terminal, and an output terminal fed back to the positive input terminal; the second self feedback converting cell 34 having a positive input terminal connected to the output terminal of the second parallel converting cell 32, a negative input terminal connected to the ground voltage terminal, and an output terminal fed back to the positive input terminal; the first cross feedback converting cell 35 having a positive input terminal connected to the output terminal of the second parallel converting cell 32, a negative input terminal connected to the ground voltage terminal, and an output terminal connected to the output terminal of the first parallel converting cell 31; and the second cross feedback converting cell 36 having a positive input terminal connected to the output terminal of the first parallel converting cell 31, a negative input terminal connected to the ground voltage terminal, and an output terminal connected to the output terminal of the second parallel converting cell 32.

The OTA is a 2-port element including an input port having a pair of terminals and an output port having a pair of terminals. For analysis of the circuit, the OTA of FIG. 2 further includes at the output port: the first output resistor connected between the output terminal of the first parallel converting cell 31 and the ground voltage terminal; and the second output resistor connected between the output terminal of the second parallel converting cell 32 and the ground voltage terminal. Preferably, the first output resistor and the second output resistor have the same resistance value.

Each of the converting cells 31, 32, 33, 34, 35, and 36 outputs, at its output terminal, a current proportional to a difference between a voltage at the positive input terminal and a voltage at the negative input terminal. The first and second parallel converting cells 31 and 32 have transconductance of $g_{m1}$, the first and second self feedback converting cells 33 and 34 have transconductance of $g_{m2a}$, and the first and second parallel converting cells 35 and 36 have transconductance of $g_{m2b}$.

The first and second parallel converting cells 31 and 32 have output admittance of $g_{o1}$ the first and second self feedback converting cells 33 and 34 have output admittance of $g_{o2a}$, and the first and second cross feedback converting cells 35 and 36 have output admittance of $g_{o2b}$. Input currents of the converting cells 31, 32, 33, 34, 35 and 36 are zero.

A first output current $i_1$ may be expressed by a sum of output currents of the first parallel converting cell 31, the first and second self feedback converting cell 33, and the first cross feedback converting cell 35, and a sum of output currents of the first parallel converting cell 31, the first and second self feedback converting cell 33, and the first cross feedback converting cell 35 resulting from the voltage vo1 at the first output node.

A second output current $i_2$ may be expressed in a similar manner. As a result, the first output current $i_1$ and the second output current $i_2$ are given by:

$$i_1 = g_{m1}(v_{i1} - v_{i2}) + g_{m2a}(v_{o1} - 0) + \quad (40)$$
$$g_{m2b}(v_{o2} - 0) + (g_{o1} + g_{o2a} + g_{o2b})v_{o1}$$

and $$i_2 = g_{m1}(v_{i2} - v_{i1}) + g_{m2a}(v_{o2} - 0) + \quad (41)$$
$$g_{m2b}(v_{o1} - 0) + (g_{o1} + g_{o2a} + g_{o2b})v_{o2}$$

There are three cases depending on a relationship among the transconductances $g_{m1}$, $g_{m2a}$, and $g_{m2b}$ of the six converting cells 31, 32, 33, 34, 35 and 36 and a relationship among the output admittances $g_{o1}$, $g_{o2a}$, and $g_{o2b}$ of the six converting cells 31, 32, 33, 34, 35 and 36.

Case 1: ($g_{m1}=g_{m2a}=g_{m2b}=g_m$ and ($g_{o1}=g_{o2a}=g_{o2b}=g_o$.

If the output admittances $g_{o1}$, $g_{o2a}$, and $g_{o2b}$ of the six converting cells 31, 32, 33, 34, 35 and 36 in the OTA shown in FIG. 2 are the same and the transconductances $g_m$, $g_{m2a}$, and $g_{m2b}$ of the six converting cells 31, 32, 33, 34, 35 and 36 are the same, Equations 40 and 41 are simplified:

$$i_1 = g_m(v_{i1} - v_{i2} + v_{o1} + v_{o2}) + 3g_o v_{o1} \quad (42)$$

and $$i_2 = g_m(v_{i2} - v_{i1} + v_{o1} + v_{o2}) + 3g_o v_{o2} \quad (43)$$

Since $$v_{o1} = -z i_1$$
$$v_{o2} = -z i_2 \quad (44),$$

Equations 42 and 43 becomes:

$$v_{o1} = -z g_m(v_{i1} - v_{i2} + v_{o1} + v_{o2}) - 3z g_o v_{o1} \quad (45)$$

and $$v_{o2} = -z g_m(v_{i2} - v_{i1} + v_{o1} + v_{o2}) - 3z g_o v_{o2} \quad (46)$$

These are rearranged into a matrix equation 47:

$$\begin{bmatrix} 1 + zg_m + 3zg_o & zg_m \\ zg_m & 1 + zg_m + 3zg_o \end{bmatrix} \begin{bmatrix} v_{o1} \\ v_{o2} \end{bmatrix} = -zg_m \begin{bmatrix} 1 & -1 \\ -1 & 1 \end{bmatrix} \begin{bmatrix} v_{i1} \\ v_{i2} \end{bmatrix} \quad (47)$$

Both sides of the matrix equation 47 are multiplied by y to obtain Equation (48):

$$\begin{bmatrix} y + g_m + 3g_o & g_m \\ g_m & y + g_m + 3g_o \end{bmatrix} \begin{bmatrix} v_{o1} \\ v_{o2} \end{bmatrix} = -g_m \begin{bmatrix} 1 & -1 \\ -1 & 1 \end{bmatrix} \begin{bmatrix} v_{i1} \\ v_{i2} \end{bmatrix} \quad (48)$$

This is a basic input/output equation of the enhanced Nauta OTA of the present exemplary embodiment. It can be seen from a comparison between Equation 48 and Equation 10, which is the basic input/output equation of the conventional Nauta OTA, that the coefficient matrix at the left side is the same in both equations, but that both the element at row 1, column 2 and the element at row 2, column 1 in the coefficient matrix at the right side of Equation 10 are 0, while that those of Equation 48 are −1.

A physical meaning of the Equation 48 may be analyzed in conjunction with a characteristic equation. When the interpretation is performed on an s-plane of the Laplace transformation, the characteristic equation may be obtained by putting a determinant of the coefficient matrix at the left side to 0. Here, a root of the characteristic equation is a pole (eigenvalue) affecting the circuit characteristics, which is used to determine the stability of the circuit. Therefore, when the Nauta OTA has the structure of the present exemplary embodiment, the characteristic equation is conserved in form and hence the pole (eigenvalue) is also conserved.

Using a capacitive load (a capacitor) as load admittance, Equation 48 is Laplace transformed into Equation 49:

$$\begin{bmatrix} sC + g_m + 3g_o & g_m \\ g_m & sC + g_m + 3g_o \end{bmatrix} \begin{bmatrix} V_{o1} \\ V_{o2} \end{bmatrix} = -g_m \begin{bmatrix} 1 & -1 \\ -1 & 1 \end{bmatrix} \begin{bmatrix} V_{i1} \\ V_{i2} \end{bmatrix} \quad (49)$$

Both sides of Equation 49 are divided by C to obtain Equations 50 and 51:

$$\begin{bmatrix} s + \dfrac{g_m + 3g_o}{C} & \dfrac{g_m}{C} \\ \dfrac{g_m}{C} & s + \dfrac{g_m + 3g_o}{C} \end{bmatrix} \begin{bmatrix} V_{o1} \\ V_{o2} \end{bmatrix} = -\dfrac{g_m}{C} \begin{bmatrix} 1 & -1 \\ -1 & 1 \end{bmatrix} \begin{bmatrix} V_{i1} \\ V_{i2} \end{bmatrix} \quad (50)$$

and $$\left\{sI - \left(-\dfrac{1}{C}\right) \underbrace{\begin{bmatrix} g_m + 3g_o & g_m \\ g_m & g_m + 3g_o \end{bmatrix}}_{A}\right\} \begin{bmatrix} V_{o1} \\ V_{o2} \end{bmatrix} = -\dfrac{g_m}{C} \begin{bmatrix} 1 & -1 \\ -1 & 1 \end{bmatrix} \begin{bmatrix} V_{i1} \\ V_{i2} \end{bmatrix} \quad (51)$$

It can be seen from a comparison between Equation 51 and Equation 13 that the matrix A is the same in the enhanced Nauta OTA of the present exemplary embodiment and the conventional Nauta OTA, but that the element at row 1, column 2 and the element at row 2, column 1 of the unit matrix in the coefficient matrix at the right side of Equation 13 are 0, while that those of Equation 51 are −1. Accordingly, the eigenvalue/eigenvector and the transformation matrix are the same as those in the conventional Nauta OTA.

Now, Equations 35 to 38, which are linear transformation equations for the input signal pair and the output signal pair using the transformation matrix R induced above, are applied to Equation 51 to obtain Equation 52:

$$\begin{bmatrix} DM_o \\ CM_o \end{bmatrix} = (2g_m) \begin{bmatrix} \dfrac{-1}{sC + 3g_o} & 0 \\ 0 & 0 \end{bmatrix} \begin{bmatrix} DM_i \\ CM_i \end{bmatrix} \quad (52)$$

The meaning of Equation 52 can be explained as follows. Equation 52 represents a forward transfer characteristic relationship between $DM_i$ and $CM_i$ at the input port and $DMo$ and $CMo$ at the output port. A first characteristic of Equation 52 is that since the transfer function matrix in Equation 52 is a diagonal matrix, a differential mode component $DM_i$ of the input signal has an effect only on a differential mode component DMo of the output signal, not on common mode component CMo of the output signal. This means that the common mode component and the differential mode component of the signal components are perfectly decoupled from each other.

Another characteristic of Equation 52 is that the output is not affected by the common mode component $CM_i$ of the input signal at all. This characteristic is very ideal considering that a signal to be processed is not carried by the common mode component, which is not the case in the conventional Nauta OTA. Such property is a unique advantage of the present invention newly introduced.

It can also be seen from a comparison between Equation 52 and Equation 39, which is a transformed form of the input/output equation of the conventional Nauta OTA, that an element at row 2, column 2 of the coefficient matrix at the right side of Equation 52 is changed into 0 and that a scalar coefficient located before the coefficient matrix is doubled. This has the following physical meanings:

First, the common mode component of the signal components is detected at the output port of the conventional Nauta OTA while it is entirely eliminated by the enhanced Nauta OTA of the present exemplary embodiment.

Second, there is a change in the way that the differential mode component of the signal components is processed. A transfer gain between the input and the output in the differential mode is doubled. This means that gm effectively doubles in light of the fact that there is no change in the gm value of the basic constituent unit block of the OTA, leading to improved efficiency.

Case 2: $(g_{m1}=g_{m2b})=g_m$, $(g_{o1}=g_{o2b})=g_o$ and $g_{m2a}=g_{o2a}=0$.

In this case, the OTA does not include the first and second self feedback converting cells 33 and 34 in the structure of FIG. 2, but includes the first and second parallel converting cells 31 and 32 and the first and second cross feedback converting cells 35 and 36, which have the same output admittance and transconductance. Since the four converting cells 31, 32, 35, 36 in the OTA of this case have the same transconductances and output admittances, Equations 40 and 41 are simplified into Equations 53 and 54:

$$i_1 = g_m(v_{i1}-v_{i2})+g_m v_{o2}+2g_o v_{o1} \quad (53)$$

and $$i_2 = g_m(v_{i2}-v_{i1})+g_m v_{o1}+2g_o v_{o2} \quad (54)$$

Since $$v_{o1}=-zi_1$$

$$v_{o2}=-zi_2 \quad (55),$$

Equations 53 and 54 becomes:

$$v_{o1}=-zg_m(v_{i1}-v_{i2}+v_{o2})-2zg_o v_{o1} \quad (56)$$

and $$v_{o2}=-zg_m(v_{i2}-v_{i1}+v_{o1})-2zg_o v_{o2} \quad (57)$$

These are rearranged into a matrix equation 58:

$$\begin{bmatrix} 1+2zg_o & zg_m \\ zg_m & 1+2zg_o \end{bmatrix} \begin{bmatrix} v_{o1} \\ v_{o2} \end{bmatrix} = -zg_m \begin{bmatrix} 1 & -1 \\ -1 & 1 \end{bmatrix} \begin{bmatrix} v_{i1} \\ v_{i2} \end{bmatrix} \quad (58)$$

Both sides of the matrix equation 58 are multiplied by y to obtain Equation 59:

$$\begin{bmatrix} y+2g_o & g_m \\ g_m & y+2g_o \end{bmatrix} \begin{bmatrix} v_{o1} \\ v_{o2} \end{bmatrix} = -g_m \begin{bmatrix} 1 & -1 \\ -1 & 1 \end{bmatrix} \begin{bmatrix} v_{i1} \\ v_{i2} \end{bmatrix} \quad (59)$$

This is a basic input/output equation of the enhanced Nauta OTA. Using a capacitive load (a capacitor) as load admittance, Equation 59 is Laplace transformed into Equation 60:

$$\begin{bmatrix} sC+2g_o & g_m \\ g_m & sC+2g_o \end{bmatrix} \begin{bmatrix} V_{o1} \\ V_{o2} \end{bmatrix} = -g_m \begin{bmatrix} 1 & -1 \\ -1 & 1 \end{bmatrix} \begin{bmatrix} V_{i1} \\ V_{i2} \end{bmatrix} \quad (60)$$

Both sides of Equation 60 are divided by C to obtain Equations 61 and 62:

$$\begin{bmatrix} s+\frac{2g_o}{C} & \frac{g_m}{C} \\ \frac{g_m}{C} & s+\frac{2g_o}{C} \end{bmatrix} \begin{bmatrix} V_{o1} \\ V_{o2} \end{bmatrix} = -\frac{g_m}{C} \begin{bmatrix} 1 & -1 \\ -1 & 1 \end{bmatrix} \begin{bmatrix} V_{i1} \\ V_{i2} \end{bmatrix} \quad (61)$$

and $$\left\{sI-\underbrace{\left(-\frac{1}{C}\right)\begin{bmatrix} 2g_o & g_m \\ g_m & 2g_o \end{bmatrix}}_{A}\right\}\begin{bmatrix} V_{o1} \\ V_{o2} \end{bmatrix} = -\frac{g_m}{C} \begin{bmatrix} 1 & -1 \\ -1 & 1 \end{bmatrix} \begin{bmatrix} V_{i1} \\ V_{i2} \end{bmatrix} \quad (62)$$

If $v_{i1}=v_{i2}=0$ (homogeneous), Equation 62 becomes:

$$(SI-A)V_o=0 \quad (63)$$

$$\Leftrightarrow AV_o=sV_o \quad (64)$$

Now we again encounter an issue of an eigenvalue/eigenvector in the form of $\vec{Ax}=\lambda\vec{x}$. An eigenvalue/eigenvector of the matrix A must be obtained for a transformation matrix for diagonalizing the matrix A. The eigenvalue can be obtained by setting the determinant of the coefficient matrix at the left side of Equation 63 to 0. Since A+=A, it can be seen that A is a Hermitian operator or a self-adjoint operator. Accordingly, from the general characteristic of the Hermitian operator, the eigenvalues are expected to have real numbers and the eigenvectors are expected to be orthogonal. Actually, the eigenvalues are found to be real numbers:

$$s=s_1, s_2 \text{ where} \quad (65)$$

$$s_1=-\frac{(2g_o-g_m)}{C}$$

$$s_2=-\frac{(2g_o+g_m)}{C}$$

Since $$g_o=\frac{1}{r_{out}},$$

$s_1$ and $s_2$ have a dimension of a reciprocal of a time constant in an RC circuit. Corresponding eigenvectors may be obtained by applying $s_1$ and $s_2$ to Equation 63. The magnitudes of the eigenvectors are normalized into 1, resulting in Equations 66 and 67:

$$|r_1> = \frac{1}{\sqrt{2}}\begin{pmatrix}1\\-1\end{pmatrix} \tag{66}$$

and $$|r_2> = \frac{1}{\sqrt{2}}\begin{pmatrix}1\\1\end{pmatrix} \tag{67}$$

These are the same as Equations 17 and 18. Accordingly, the transformation matrix R is given by Equation 19. (Here, $|r_i>$ is a column vector and $<r_j|$ is a row vector.) As mentioned above, since the two unit vectors have a relationship where $<r_i|r_j> = \delta_{ij}$, they are orthogonal.

Now, Equations 35 to 38, which are linear transformation equations for the input signal pair and the output signal pair using the transformation matrix R induced above, are applied to Equation 62 to obtain Equation 68:

$$\begin{bmatrix}DM_o\\CM_o\end{bmatrix} = (2g_m)\begin{bmatrix}\frac{-1}{sC+2g_0-g_m} & 0\\0 & 0\end{bmatrix}\begin{bmatrix}DM_i\\CM_i\end{bmatrix} \tag{68}$$

It should be noted that Equation 68 differs from the corresponding equation in Case 1 in one important aspect. That is, the denominator at the right side of the Equation 68 includes $g_m$, which means that a position of a pole can be adjusted by $g_m$ now. In other words, the quality factor can be adjusted by $g_m$. However, there remains one problem in that the same $g_m$ is also used to adjust a cutoff frequency. Therefore, independent adjustment of the quality factor is still a lacking property. To solve this problem, the following method is proposed in Case 3:

Case 3: $g_{m1} \neq g_{m2b}(\equiv g_{m2})$, $g_{o1} \neq g_{o2b}(\equiv g_{o2})$ and $g_{m2a} = g_{o2a} = 0$.

An OTA of Case 3 does not include the first and second self feedback converting cells 33 and 34 in the structure of FIG. 2, but includes the first and second parallel converting cells 31 and 32 having the same transconductance $g_{m1}$ and output admittance $g_{o1}$ and the first and second cross feedback converting cells 35 and 36 having the same transconductance $g_{m2b}$ and output admittance $g_{o2b}$. Accordingly, Equations 40 and 41 are simplified:

$$i_1 = g_{m1}(v_{i1}-v_{i2}) + g_{m2}v_{o2} + (g_{o1}+g_{o2})v_{o1} \tag{69}$$

and $$i_2 = g_{m1}(v_{i2}-v_{i1}) + g_{m2}v_{o1} + (g_{o1}+g_{o2})v_{o2} \tag{70}$$

Since $$v_{o1} = -zi_1$$
$$v_{o2} = -zi_2 \tag{71}$$

Equations 69 and 70 becomes:

$$v_{o1} = -zg_{m1}(v_{i1}-v_{i2}) - zg_{m2}v_{o2} - z(g_{o1}+g_{o2})v_{o1} \tag{72}$$

and $$v_{o2} = -zg_{m1}(v_{i2}-v_{i1}) - zg_{m2}v_{o1} - z(g_{o1}+g_{o2})v_{o2} \tag{73}$$

These are rearranged into a matrix equation 74:

$$\begin{bmatrix}1+z(g_{o1}+g_{o2}) & zg_{m2}\\zg_{m2} & 1+z(g_{o1}+g_{o2})\end{bmatrix}\begin{bmatrix}v_{o1}\\v_{o2}\end{bmatrix} = -zg_{m1}\begin{bmatrix}1 & -1\\-1 & 1\end{bmatrix}\begin{bmatrix}v_{i1}\\v_{i2}\end{bmatrix} \tag{74}$$

Both sides of the matrix equation are multiplied by y to obtain Equation (75):

$$\begin{bmatrix}y+(g_{o1}+g_{o2}) & g_{m2}\\g_{m2} & y+(g_{o1}+g_{o2})\end{bmatrix}\begin{bmatrix}v_{o1}\\v_{o2}\end{bmatrix} = -g_{m1}\begin{bmatrix}1 & -1\\-1 & 1\end{bmatrix}\begin{bmatrix}v_{i1}\\v_{i2}\end{bmatrix} \tag{75}$$

This is a basic input/output equation of the enhanced Nauta OTA. Using a capacitive load (a capacitor) as load admittance, Equation 75 is Laplace transformed into Equation 76:

$$\begin{bmatrix}sC+(g_{o1}+g_{o2}) & g_{m2}\\g_{m2} & sC+(g_{o1}+g_{o2})\end{bmatrix}\begin{bmatrix}V_{o1}\\V_{o2}\end{bmatrix} = -g_{m1}\begin{bmatrix}1 & -1\\-1 & 1\end{bmatrix}\begin{bmatrix}V_{i1}\\V_{i2}\end{bmatrix} \tag{76}$$

Both sides of Equation 76 are divided by C to obtain Equations 77 and 78:

$$\begin{bmatrix}s+\frac{(g_{o1}+g_{o2})}{C} & \frac{g_{m2}}{C}\\\frac{g_{m2}}{C} & s+\frac{(g_{o1}+g_{o2})}{C}\end{bmatrix}\begin{bmatrix}V_{o1}\\V_{o2}\end{bmatrix} = -\frac{g_{m1}}{C}\begin{bmatrix}1 & -1\\-1 & 1\end{bmatrix}\begin{bmatrix}V_{i1}\\V_{i2}\end{bmatrix} \tag{77}$$

and $$\left\{sI - \underbrace{\left(-\frac{1}{C}\right)\begin{bmatrix}(g_{o1}+g_{o2}) & g_{m2}\\g_{m2} & (g_{o1}+g_{o2})\end{bmatrix}}_{A}\right\}\begin{bmatrix}V_{o1}\\V_{o2}\end{bmatrix} = \tag{78}$$

$$-\frac{g_{m1}}{C}\begin{bmatrix}1 & -1\\-1 & 1\end{bmatrix}\begin{bmatrix}V_{i1}\\V_{i2}\end{bmatrix}$$

If $v_{i1} = v_{i2} = 0$ (homogeneous), Equation 78 becomes:

$$(sI-A)v_o = 0 \tag{79}$$

$$\Leftrightarrow Av_o = sV_o \tag{80}$$

Now we again encounter an issue of an eigenvalue/eigenvector in the form of $A\vec{x}> = \lambda\vec{x}$. An eigenvalue/eigenvector of the matrix A must be obtained for a transformation matrix for diagonalizing the matrix A. The eigenvalue can be obtained by setting the determinant of the coefficient matrix at the left side of Equation 79 to 0. Since $A+=A$, it can be seen that A is a Hermitian operator or a self-adjoint operator. Accordingly, from the general characteristic of the Hermitian operator, the eigenvalues are expected to have real numbers and the eigenvectors are expected to be orthogonal. Actually, the eigenvalues are found to be real numbers:

$$s = s_1, s_2 \text{ where} \tag{81}$$
$$s_1 = -\frac{\{(g_{o1} + g_{o2}) - g_{m2}\}}{C}$$
$$s_2 = -\frac{\{(g_{o1} + g_{o2}) + g_{m2}\}}{C}$$

Since $$g_o = \frac{1}{r_{out}},$$

$s_1$ and $s_2$ have a dimension of a reciprocal of a time constant in an RC circuit. Corresponding eigenvectors may be obtained by applying $s_1$ and $s_2$ to Equation 79. The magnitudes of the eigenvectors are normalized into 1, resulting in Equations 82 and 83:

$$|r_1> = \frac{1}{\sqrt{2}}\begin{pmatrix} 1 \\ -1 \end{pmatrix} \tag{82}$$

and $$|r_2> = \frac{1}{\sqrt{2}}\begin{pmatrix} 1 \\ 1 \end{pmatrix} \tag{83}$$

These are the same as Equations 17 and 18. Accordingly, the transformation matrix R is given by Equation 19. (Here, $|r_i>$ denotes a column vector and $<r_j|$ denotes a row vector.) As mentioned above, since the two unit vectors have a relationship where $<r_i|r_j> = \delta_{ij}$, they are orthogonal. Now, Equations 35 to 38, which are linear transformation equations for the input signal pair and the output signal pair using the transformation matrix R induced above, are applied to Equation 78 to obtain Equation 84:

$$\begin{bmatrix} DM_i \\ CM_i \end{bmatrix} = (2g_m) \begin{bmatrix} \frac{-1}{sC_1 + (g_{01} + g_{02}) - g_{m2}} & 0 \\ 0 & 0 \end{bmatrix} \begin{bmatrix} DM_o \\ CM_o \end{bmatrix} \tag{84}$$

In contrast to Case 2 where both the quality factor and the cutoff frequency are adjusted by same $g_m$, in Case 3 the cutoff frequency is adjusted by $g_{m1}$ and the quality factor is adjusted by $g_{m2}$, as indicated by Equation 84, thereby achieving independent adjustment of the quality factor.

Figure 5:
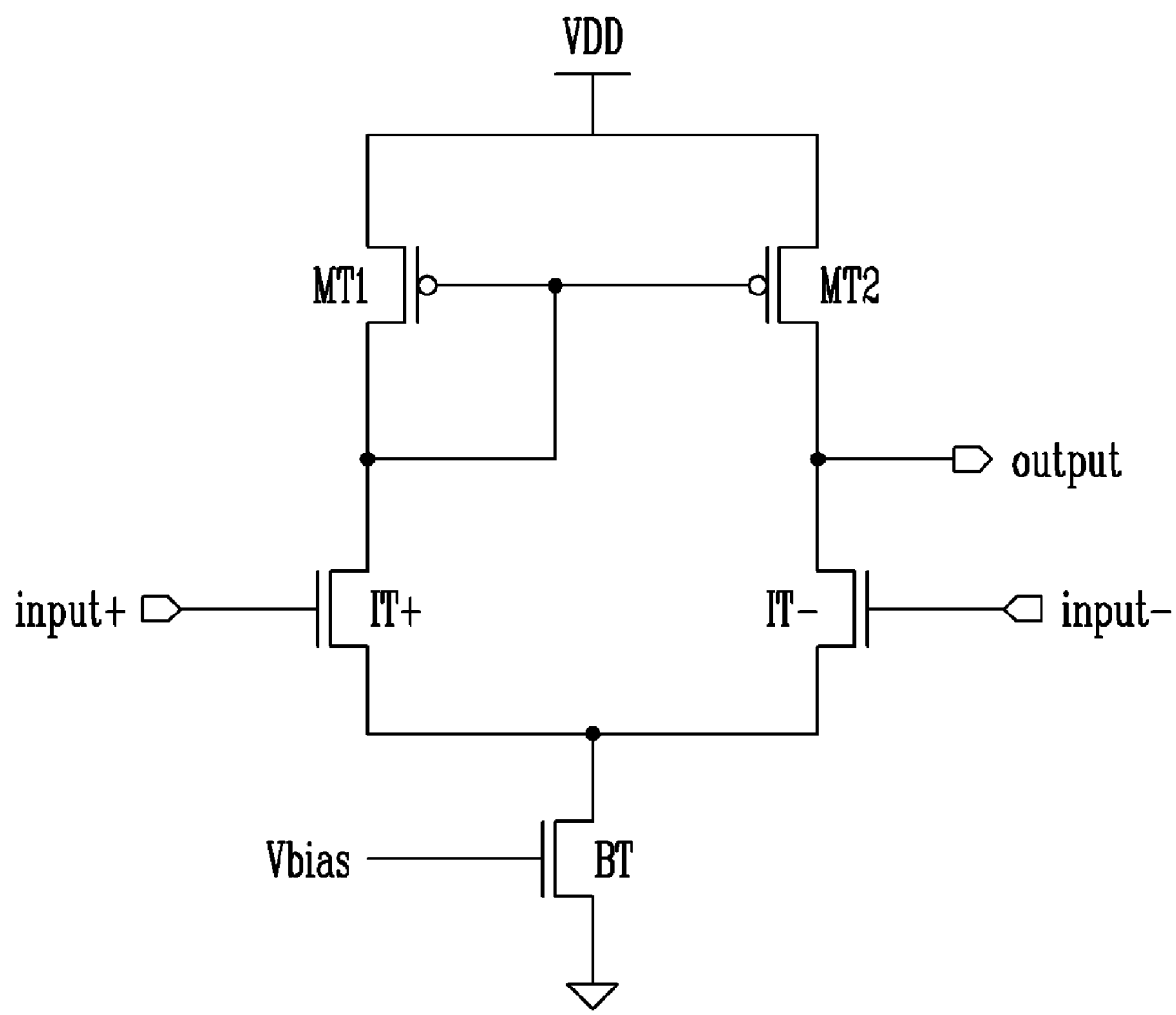
FIG. 5 is a circuit diagram of a voltage difference-current converting cell that may constitute the enhanced Nauta OTA according to an exemplary embodiment of the present invention.

FIG. 5 shows a voltage difference-current converting cell that may be used to configure the OTA according to the exemplary embodiment of the present invention. The voltage difference-current converting cell is implemented by a 2 input-1 output differential amplifier consisting of five Metal-Oxide-Semiconductor (MOS) transistors.

Specifically, the voltage difference-current converting cell comprises: a pair of mirror transistors MT1 and MT2 for forcibly equalizing amounts of current flowing through two current paths; a positive and negative input transistors IT+ and IT− for establishing the two current paths and receiving a positive input signal and a negative input signal at their gates, respectively; and a bias transistor BT for receiving a bias voltage and supplying the same DC current to the two input transistors IT+ and IT−.

Since the present invention may be implemented by the enhanced Nauta OTA consisting of the voltage difference-current converting cell of the 2 input-1 output structure, the present invention is not limited to the exemplary embodiment shown in FIG. 5.

As described above, in the enhanced OTA according to the present invention, a common mode signal component which has been a problem in a circuit structure of a conventional Nauta OTA can be perfectly eliminated.

According to the present invention, the OTA has an effectively enhanced quality factor by independently controlling the quality factor without affecting a transconductance value required for frequency characteristics of the filter.

According to the present invention, the OTA can use a smaller number of basic unit converting cells than a conventional Nauta OTA to achieve these characteristics.

According to the present invention, the OTA has a two times higher transfer gain between the input and the output in the differential mode than a conventional Nauta OTA.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An operational transconductance amplifier (OTA) for receiving the first and the second input voltages and outputting the first and the second output currents proportional to a voltage difference between the first and the second input voltages, the amplifier comprising:
   the first parallel converting cell having a positive input terminal for receiving the first input voltage and a negative input terminal for receiving the second input voltage;
   the second parallel converting cell having a positive input terminal for receiving the second input voltage and a negative input terminal for receiving the first input voltage;
   the first cross feedback converting cell having a positive input terminal connected to an output terminal of the second parallel converting cell, a negative input terminal connected to a ground voltage terminal, and an output terminal connected to an output terminal of the first parallel converting cell; and
   the second cross feedback converting cell having a positive input terminal connected to the output terminal of the first parallel converting cell, a negative input terminal connected to the ground voltage terminal, and an output terminal connected to the output terminal of the second parallel converting cell.

2. The amplifier of claim 1, further comprising:
   the first self feedback converting cell having a positive input terminal connected to the output terminal of the first parallel converting cell, a negative input terminal connected to the ground voltage terminal, and an output terminal fed back to the positive input terminal; and
   the second self feedback converting cell having a positive input terminal connected to the output terminal of the second parallel converting cell, a negative input terminal connected to the ground voltage terminal, and an output terminal fed back to the positive input terminal.

3. The amplifier of claim 1, wherein each converting cell outputs a current via the output terminal, the current being in proportion to a difference between a voltage applied to the positive input terminal and a voltage applied to the negative input terminal.

4. The amplifier of claim 1, wherein the first and the second parallel converting cells have the same transconductance and output admittance, and the first and the second cross feedback converting cells have the same transconductance and output admittance.

5. The amplifier of claim 4, wherein the first and the second parallel converting cells and the first and the second cross feedback converting cells have the same transconductance and output admittance.

6. The amplifier of claim 2, wherein the first and the second parallel converting cells have the same transconductance and output admittance, the first and the second self feedback converting cells have the same transconductance and output admittance, and the first and the second cross feedback converting cells have the same transconductance and output admittance.

7. The amplifier of claim 6, wherein the first and the second parallel converting cells, the first and the second self feedback converting cells, and the first and the second cross feedback converting cells have the same transconductance and output admittance.

8. The amplifier of claim 1, wherein each converting cell comprises:

a pair of mirror transistors for forcibly equalizing amounts of current flowing through two current paths;

positive and negative input transistors for establishing the two current paths, respectively, the transistors having gates for receiving positive and negative input signals, respectively; and a bias transistor for receiving a bias voltage and supplying the same DC current to the positive input transistor and the negative input transistor.

9. The amplifier of claim 2, wherein each converting cell outputs a current via the output terminal, the current being in proportion to a difference between a voltage applied to the positive input terminal and a voltage applied to the negative input terminal.

10. The amplifier of claim 2, wherein each converting cell comprises:

a pair of mirror transistors for forcibly equalizing amounts of current flowing through two current paths;

positive and negative input transistors for establishing the two current paths, respectively, the transistors having gates for receiving positive and negative input signals, respectively; and a bias transistor for receiving a bias voltage and supplying the same DC current to the positive input transistor and the negative input transistor.

* * * * *